(12) United States Patent
Uehara et al.

(10) Patent No.: US 12,260,278 B2
(45) Date of Patent: Mar. 25, 2025

(54) CARD-TYPE MEDIUM AND CARD-TYPE MEDIUM MANUFACTURING METHOD

(71) Applicant: TOPPAN INC., Tokyo (JP)

(72) Inventors: Eriko Uehara, Tokyo (JP); Yukiko Katano, Tokyo (JP); Shigeki Minemura, Tokyo (JP)

(73) Assignee: TOPPAN INC., Tokyo (JP)

( * ) Notice: Subject to any disclaimer, the term of this patent is extended or adjusted under 35 U.S.C. 154(b) by 0 days.

(21) Appl. No.: 18/221,279

(22) Filed: Jul. 12, 2023

(65) Prior Publication Data

US 2023/0359857 A1 Nov. 9, 2023

Related U.S. Application Data

(63) Continuation of application No. PCT/JP2021/038130, filed on Oct. 14, 2021.

(30) Foreign Application Priority Data

Jan. 14, 2021 (JP) .................................. 2021-004389

(51) Int. Cl.
*G06K 19/077* (2006.01)
*G06K 19/07* (2006.01)
(Continued)

(52) U.S. Cl.
CPC ... *G06K 19/07745* (2013.01); *G06K 19/0718* (2013.01); *G06K 19/07743* (2013.01); *H05K 1/09* (2013.01); *H05K 1/186* (2013.01)

(58) Field of Classification Search
CPC ........... G06K 19/077; G06K 19/07743; G06K 19/07745; G06K 19/07747; H05K 1/186; H05K 1/09
See application file for complete search history.

(56) References Cited

U.S. PATENT DOCUMENTS

| 4,714,980 A | * | 12/1987 | Hara | ........................ H01L 24/50 |
| | | | | 235/492 |
| 5,729,150 A | * | 3/1998 | Schwindt | ................. G01R 1/18 |
| | | | | 324/754.03 |

(Continued)

FOREIGN PATENT DOCUMENTS

| JP | 2003-288573 A | 10/2003 |
| JP | 2010-504583 A | 2/2010 |

(Continued)

OTHER PUBLICATIONS

International Searching Authority, "International Search Report," issued in connection with International Patent Application No. PCT/JP2021/038130, dated Jan. 18, 2022.

(Continued)

*Primary Examiner* — Daniel I Walsh
(74) *Attorney, Agent, or Firm* — Foley & Lardner LLP

(57) ABSTRACT

A card-type medium includes a card body; an exposed component that is accommodated inside an opening formed in a front surface of the card body and is disposed so as to be partially exposed on the front surface; and a circuit board that is embedded in the card body and to which the exposed component is attached. The exposed component includes a first exposed component that is attached to the circuit board with an intermediate spacer interposed therebetween. The first exposed component and the intermediate spacer are joined together by a first conductive joining material. The circuit board and the intermediate spacer are joined together by a second conductive joining material. A joint-forming temperature of the first conductive joining material and a joint-forming temperature of the second conductive joining material are different from each other.

15 Claims, 5 Drawing Sheets

(51) Int. Cl.
*H05K 1/09* (2006.01)
*H05K 1/18* (2006.01)

(56) References Cited

U.S. PATENT DOCUMENTS

| | | | | |
|---|---|---|---|---|
| 6,323,064 B1* | 11/2001 | Lee | | H01L 23/3121 |
| | | | | 257/E23.125 |
| 6,686,656 B1* | 2/2004 | Koh | | H01L 25/0657 |
| | | | | 257/777 |
| 10,694,637 B1* | 6/2020 | Wolf | | H01Q 1/002 |
| 11,755,873 B1* | 9/2023 | Finn | | G06K 19/07749 |
| | | | | 235/492 |
| 2002/0170974 A1* | 11/2002 | Kashima | | G06K 19/07749 |
| | | | | 235/492 |
| 2003/0209362 A1 | 11/2003 | Kasuga et al. | | |
| 2005/0052924 A1* | 3/2005 | Nishizawa | | G06K 19/07732 |
| | | | | 257/E23.176 |
| 2006/0087016 A1* | 4/2006 | Wada | | H05K 3/284 |
| | | | | 257/679 |
| 2008/0290142 A1* | 11/2008 | Hougham | | B23K 1/19 |
| | | | | 228/180.1 |
| 2010/0224973 A1* | 9/2010 | Han | | B29C 66/1142 |
| | | | | 228/246 |
| 2010/0230161 A1* | 9/2010 | Hoshi | | H01L 24/45 |
| | | | | 228/265 |
| 2010/0230496 A1 | 9/2010 | Kim | | |
| 2011/0079799 A1* | 4/2011 | Lee | | C09J 7/20 |
| | | | | 428/323 |
| 2012/0069528 A1* | 3/2012 | Bindrup | | B23K 1/0016 |
| | | | | 361/728 |
| 2013/0201631 A1* | 8/2013 | Parker | | H05K 1/186 |
| | | | | 361/728 |
| 2014/0234572 A1* | 8/2014 | Droz | | G06K 19/07718 |
| | | | | 428/156 |
| 2014/0350407 A1* | 11/2014 | Chaggares | | A61B 8/4494 |
| | | | | 600/459 |
| 2015/0078810 A1* | 3/2015 | Koep | | B23K 35/26 |
| | | | | 228/248.1 |
| 2016/0098111 A1* | 4/2016 | Tsukamoto | | G06F 3/04164 |
| | | | | 345/173 |
| 2016/0127623 A1* | 5/2016 | Shimada | | G02B 7/10 |
| | | | | 348/360 |
| 2018/0290225 A1* | 10/2018 | Riegel | | B23K 3/0638 |
| 2019/0102665 A1 | 4/2019 | Snell et al. | | |
| 2019/0266469 A1* | 8/2019 | Uehara | | G06K 19/077 |
| 2019/0350077 A1* | 11/2019 | Gipson | | G02B 6/0055 |
| 2020/0135598 A1* | 4/2020 | Watanuki | | H05K 1/189 |
| 2021/0025761 A1* | 1/2021 | Altenbeck | | G01J 5/0804 |
| 2021/0315107 A1* | 10/2021 | Vasudevan | | H05K 3/3489 |
| 2022/0131021 A1* | 4/2022 | Hermes | | H01L 27/14665 |
| 2022/0215220 A1* | 7/2022 | Mathieu | | G06K 19/0718 |
| 2023/0197660 A1* | 6/2023 | Deng | | H01L 24/16 |
| | | | | 257/668 |
| 2023/0306214 A1* | 9/2023 | Katano | | G06K 19/0718 |
| 2023/0359857 A1* | 11/2023 | Uehara | | H05K 1/186 |
| 2024/0008182 A1* | 1/2024 | Park | | H05K 3/341 |
| 2024/0046692 A1* | 2/2024 | Lee | | G06V 40/1329 |
| 2024/0313121 A1* | 9/2024 | Saito | | H01L 29/792 |

FOREIGN PATENT DOCUMENTS

| | | | |
|---|---|---|---|
| JP | 2019-511058 A | | 4/2019 |
| KR | 101760675 B1 | * | 7/2017 |
| KR | 10-2043101 B1 | | 12/2019 |

OTHER PUBLICATIONS

International Searching Authority, "Written Opinion," issued in connection with International Patent Application No. PCT/JP2021/038130, dated Jan. 18, 2022.

European Extended Search Report issued in corresponding European Patent Application No. 21919522.9 dated Jun. 7, 2024 (6 pages).

* cited by examiner

CARD-TYPE MEDIUM AND CARD-TYPE MEDIUM MANUFACTURING METHOD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/038130, filed on Oct. 14, 2021, which in turn claims the benefit of JP 2021-004389, filed Jan. 14, 2021, the disclosures of all which are incorporated herein by reference in its entirety.

TECHNICAL FIELD

The present invention relates to card-type media and card-type medium manufacturing methods.

BACKGROUND

Conventionally, many kinds of card-type media have been developed, such as credit cards, cash cards, prepaid cards, membership cards, gift cards, and membership passes. Furthermore, recent years have seen a growth in popularity of card-type media in which integrated circuit (IC) modules including communication functions are embedded to provide various functions (hereinafter also referred to as "IC cards"). Such IC cards including communication functions also perform contactless communication with a reader/writer using a communication technique involving electromagnetic induction such as radio-frequency identification (RFID).

In an IC card, a circuit board and elements such as an antenna and an IC module mounted on the circuit board are embedded in a card body. For example, Patent Literature (PTL) 1 discloses a configuration including: a secure element and a fingerprint processing unit that are connected to a flexible circuit board; and a contact pad electrically connected to the secure element. In the configuration disclosed in PTL 1, the contact pad is disposed so as to be exposed on a surface (front surface) of a card body. The contact pad fits into an opening formed in the surface of the card body.

CITATION LIST

[Patent Literature] PTL 1: JP 2019-511058 A.

SUMMARY OF THE INVENTION

Technical Problem

There are cases where, for the purpose of vertical alignment, intermediate spacers are interposed when attaching, to a circuit board embedded in a card body, exposed components such as a contact terminal and a fingerprint sensor that are disposed so as to be partially exposed on a card surface. However, in such cases, the exposed components may be positioned with lower precision due to relative displacement of the exposed components and the intermediate spacers.

The present invention has been conceived in view of the aforementioned circumstances and provides a card-type medium having a structure that allows more precise positioning of an exposed component that is attached to a circuit board with an intermediate spacer interposed therebetween, and a method for manufacturing the card-type medium.

Solution to Problem

A card-type medium according to an aspect of the present invention includes: a card body; an exposed component that is accommodated inside an opening formed in a front surface of the card body and is disposed so as to be partially exposed on the front surface; and a circuit board that is embedded in the card body and to which the exposed component is attached. The exposed component includes a first exposed component that is attached to the circuit board with an intermediate spacer interposed therebetween. The first exposed component and the intermediate spacer are joined together by a first conductive joining material. The circuit board and the intermediate spacer are joined together by a second conductive joining material. A joint-forming temperature of the first conductive joining material and a joint-forming temperature of the second conductive joining material are different from each other.

A card-type medium manufacturing method according to an aspect of the present invention is a method for manufacturing the above-described card-type medium including a configuration in which the joint-forming temperature of the first conductive joining material is higher than the joint-forming temperature of the second conductive material. The method includes: joining the first exposed component and the intermediate spacer by the first conductive joining material; and joining, by the second conductive joining material, the circuit board and the intermediate spacer joined to the first exposed component.

A card-type medium manufacturing method according to an aspect of the present invention is a method for manufacturing the above-described card-type medium including a configuration in which the joint-forming temperature of the second conductive joining material is higher than the joint-forming temperature of the first conductive material. The card-type medium manufacturing method includes: joining the circuit board and the intermediate spacer by the second conductive joining material; and joining, by the first conductive joining material, the first exposed component and the intermediate spacer joined to the circuit board.

Advantageous Effects of the Invention

According to the above-described aspects of the present invention, it is possible to provide a card-type medium and a card-type medium manufacturing method in which structural components can be stably disposed at desired positions.

DETAILED DESCRIPTION

In the present embodiment, a joint-forming temperature of a joining material refers to the minimum temperature at which joining is successful with the joining material. For example, the joint-forming temperature of a metal joining material such as solder is substantially synonymous with the melting point thereof. The joint-forming temperature of a material including conductive particles dispersed in a thermoplastic resin such as anisotropic solder is a temperature depending on the physical properties of the resin and the conductive particles included.

The joint-forming temperature of a joining material can be determined, for example, by conducting various tests on card-type media in which different temperatures have been applied to the joining material and examining whether electrical joining and mechanical joining satisfy predetermined requirements. In the present embodiment, electrical conduction is checked and in addition, tests are conducted based on 5.8 dynamic bending stress and 5.9 dynamic torsional stress specified in JIS X 6305-1 (Identification cards test methods—Part 1: General characteristics) and based on IEC 60749-25 (Semiconductor devices—Mechanical and climatic test methods—Part 25: Temperature cycling).

Figure 1:
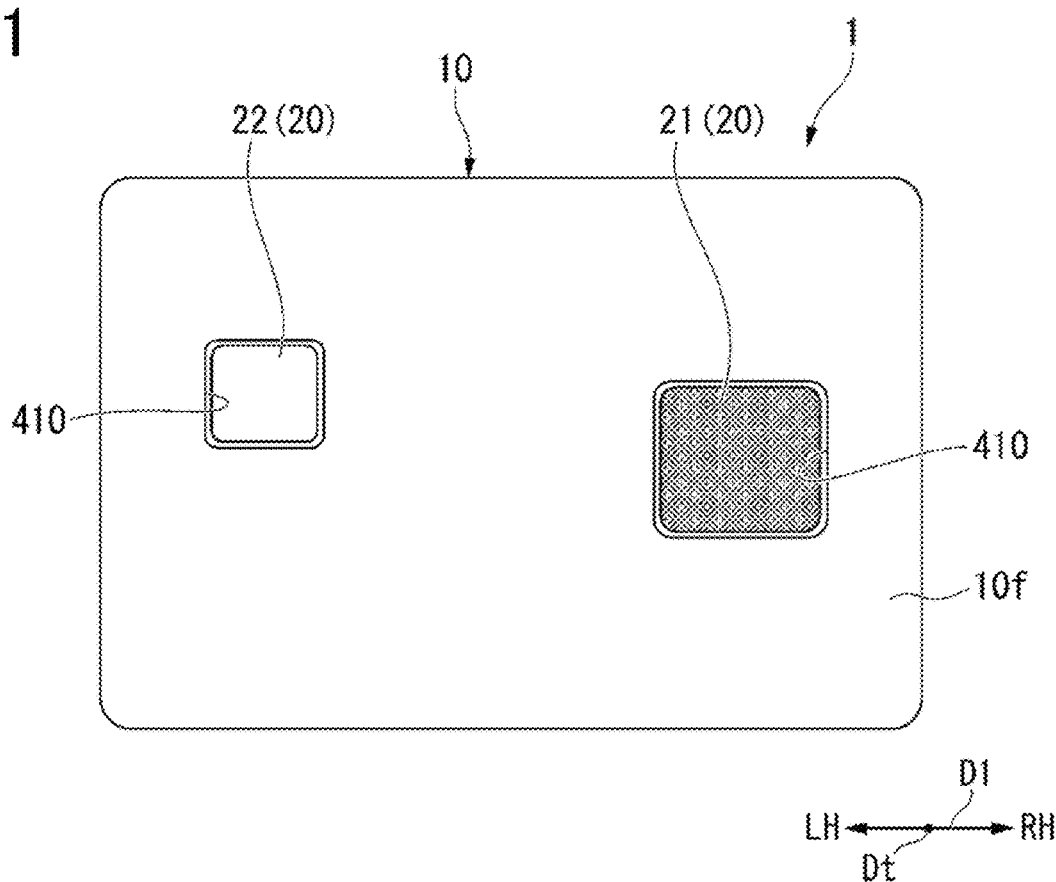
FIG. 1 is an external view of an IC card according to an embodiment of the present invention, when viewed from the front.
Figure 2:
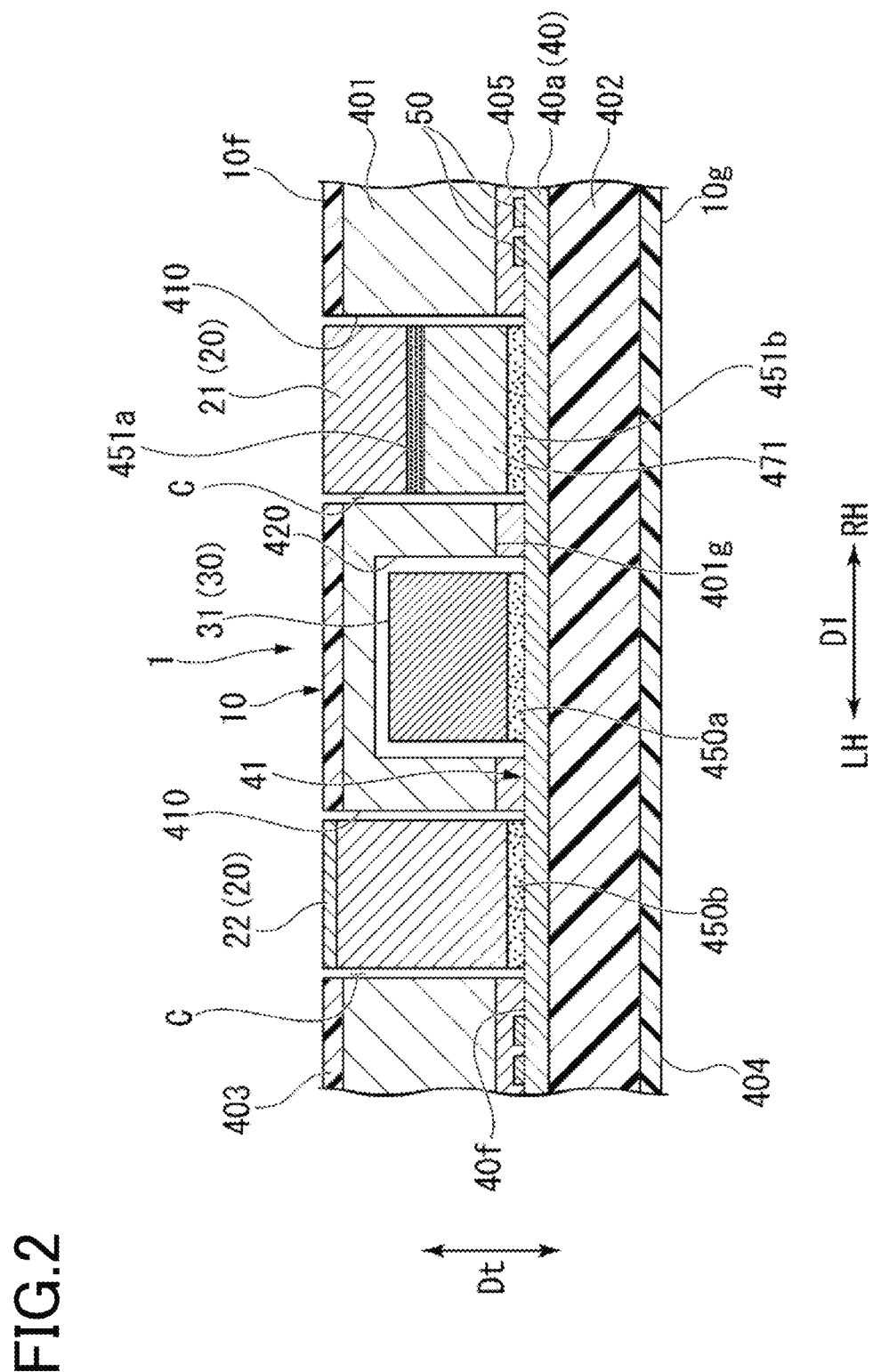
FIG. 2 is a cross-sectional view of the IC card according to the embodiment of the present invention.

With reference to FIGS. 1 to 5, an IC card according to an embodiment of the present invention will be described. FIG. 1 is an external view of the IC card according to the embodiment of the present invention, when viewed from the front. FIG. 2 is a cross-sectional view of the IC card according to the embodiment of the present invention. An IC card 1 according to the present embodiment shown in FIG. 1 and FIG. 2 is a dual interface IC card including a contact terminal 22 which is a contact interface and an antenna 50 (refer to FIG. 2) which is a contactless interface. Furthermore, the IC card 1 according to the present embodiment includes a biometric authentication function using a fingerprint sensor 21. As shown in FIG. 1 and FIG. 2, the IC card 1 (the card-type medium) includes a card body 10, an exposed component 20, an encapsulated component 30, a circuit board 40, and an antenna 50. In the present embodiment, the exposed component 20 includes the fingerprint sensor 21 and the contact terminal 22.

The card body 10 is in the shape of a plate and formed in the shape of a rectangle when viewed in a card thickness direction Dt (refer to FIG. 2) orthogonal to a front surface 10f of the card body 10. The card thickness direction Dt is perpendicular to the front surface 10f and a back surface 10g of the card body 10. Note that the front surface 10f is a surface located at the top in FIG. 2 among the surfaces of the card body 10 in the card thickness direction Dt. Note that the back surface 10g is a surface located at the bottom in FIG. 2 among the surfaces of the card body 10 in the card thickness direction Dt. In the following description, "the front surface 10f side" refers to an area at the top in FIG. 2, and "the back surface 10g side" refers to an area at the bottom in FIG. 2.

The card body 10 is formed so that the thickness thereof in the card thickness direction Dt is approximately 0.5 to 1.0 mm, for example. When the IC card 1 is a credit card, the card body 10 has a thickness of 0.76 mm. As shown in FIG. 2, the card boy 10 is formed by stacking a plurality of sheet-shaped card substrates 401, 402, in the card thickness direction Dt.

An opening 410 which accommodates the exposed component 20 is formed in the card substrate 401 disposed on the front surface 10f side in the card body 10. In the present embodiment, two openings 410 are formed. The fingerprint sensor 21 and the contact terminal 22 are accommodated in the openings 410. The openings 410 are formed penetrating the card substrate 401 in the card thickness direction Dt.

In the present embodiment, the card substrate 401 is formed from an electrically conductive metal material such as stainless steel or a titanium alloy. The thickness of the card substrate 401 in the card thickness direction Dt is between 100 μm and 500 μm, inclusive, for example. The card substrate 401 may be formed of a plastic substrate.

In the card substrate 401, a recess 420 is formed in a substrate back surface 401g facing the back surface 10g side in the card thickness direction Dt. The recess 420 is formed so as to be depressed from the substrate back surface 401g toward the front surface 10f in the card thickness direction Dt. The encapsulated component 30 is accommodated in the recess 420. When the card substrate 401 is formed from a metal material, the openings 410 and the recess 420 are formed by laser beam machining, cutting, or the like.

The card substrate 402, which is disposed on the back surface 10g side in the card body 10, is formed of an insulating plastic substrate including a polyester-based material such as amorphous polyester, a vinyl chloride-based material such as PVC (polyvinyl chloride), a polycarbonate-based material, PET-G (polyethylene terephthalate copolymer), or the like, for example.

An external resin layer 403 and an external resin layer 404 are formed on a front-surface-10f-side surface of the card substrate 401 and a back-surface-10g-side surface of the card substrate 402, respectively. The external resin layer 404 forms the front surface 10f of the card body 10. The external resin layer 403 forms the back surface 10g of the card body 10. The external resin layer 403 covers the entire front-surface-10f-side surface of the card substrate 401 except the opening 410. The external resin layer 404 covers the entire back-surface-10g-side surface of the card substrate 402. The external resin layers 403, 404 are formed by lamination (of films), for example.

In the present embodiment, the card substrate 401 and the card substrate 402 are integrated through converting processes using heat press laminates, adhesives, and the like. The card substrate 401 and the card substrate 402 may be integrated through cold press lamination using a two-component curable resin, a normal temperature curable resin, or a UV (ultraviolet) curable resin. In the present embodiment, a ferrite layer 405 is disposed between the card substrate 401 and the card substrate 402.

The circuit board 40 is embedded in the card body 10. In the present embodiment, the circuit board 40 is located between the card substrate 401 and the card substrate 402 in the card thickness direction Dt. More specifically, the circuit board 40 is sandwiched between the ferrite layer 405 and the card substrate 402 in the card thickness direction Dt. Although not shown in the drawings, the circuit board 40 is disposed on the inner side of the outer edge of the card body 10 when viewed in the card thickness direction Dt. Although not shown in the drawings, the circuit board 40 has a rectangular outline when viewed in the card thickness direction Dt. The thickness of the circuit board 40 in the card thickness direction Dt is between 15 μm and 50 μm, inclusive, for example. In the present embodiment, the circuit board 40 is disposed in a plane orthogonal to the card thickness direction Dt, along a front-surface-10f-side surface of the card substrate 402 which is disposed on the back surface 10g side in the card body 10.

In the present embodiment, the circuit board 40 includes a flexible circuit board. The circuit board 40 includes a base substrate 40a including insulating materials such as polyethylene terephthalate (PET), polyethylene naphthalate (PEN), polycarbonate (PC), polyimide (PI), and glass epoxy. Although not shown in the drawings, a predetermined wiring pattern formed of a thin conductive film of aluminum, copper, or the like by etching or the like is disposed on a surface of the base substrate 40a of the circuit board 40. In the present embodiment, a wiring pattern is disposed on a front-surface-10f-side surface of the base substrate 40a, for example.

The encapsulated component 30 is embedded in the card body 10. In the present embodiment, the IC card 1 includes an IC chip 31 as the encapsulated component 30. The IC chip 31 is joined to a board front surface 40f of the circuit board 40 which faces the front surface 10f side. The IC chip 31 is accommodated in the recess 420. A gap is provided between the IC chip 31 and an inner side surface of the recess 420. In the present embodiment, the IC chip 31 is joined by a conductive joining material 450a to a front-surface-10f-side surface (the board front surface 40f) of the circuit board 40. The conductive joining material 450a is, for example, anisotropic solder having a joint-forming temperature of 180° C. or lower. In the present invention, the anisotropic solder refers to a material in which conductive solder particles are dispersed in a thermoplastic resin.

The IC chip 31 is what is called a secure IC microcomputer and includes, for example: a fingerprint authentication function using the fingerprint sensor 21; and a communication function that performs external communication via the contact terminal 22 or the antenna 50. As the IC chip 31, a chip having a known configuration with a contact communication function and a contactless communication function can be used. Although not shown in the drawings, the IC chip 31 is formed in the shape of a rectangle when viewed in the card thickness direction Dt.

The IC chip 31 is electrically connected to the fingerprint sensor 21, the contact terminal 22, and the antenna 50 via the wiring pattern formed on the circuit board 40. Specifically, the circuit board 40 includes: a fingerprint sensor wiring part that electrically connects the IC chip 31 and the fingerprint sensor 21; a contact terminal wiring part that electrically connects the IC chip 31 and the contact terminal 22; and an antenna wiring part that electrically connects the IC chip 31 and the antenna 50.

The exposed component 20 is accommodated inside the opening 410 formed in the front surface 10f of the card body 10 and is disposed so as to be partially exposed on the front surface 10f. As mentioned above, in the present embodiment, the exposed component 20 includes the fingerprint sensor 21 (the first exposed component) and the contact terminal 22 (the second exposed component). The fingerprint sensor 21 and the contact terminal 22 are mounted on the board front surface 40f of the circuit board 40. In other words, the exposed component 20 is attached to the circuit board 40.

In the present embodiment, the fingerprint sensor 21 is the first exposed component that is attached to the circuit board 40 via an intermediate spacer 471. The fingerprint sensor 21 is formed in the shape of a rectangle when viewed in the card thickness direction Dt. Although not shown in the drawings, the fingerprint sensor 21 has a configuration in which a protective film is provided so as to cover multiple electrodes. As shown in FIG. 1, the fingerprint sensor 21 is disposed on one side (the RH side) of a center portion of the front surface 10f of the card body 10 in a longitudinal direction D1 of the card body 10.

In the intermediate spacer 471, connecting electrodes (not shown in the drawings) made of copper foils or the like are formed on the front surface and the back surface of an insulating base substrate made of glass epoxy or the like. The connecting electrodes on the front surface and the back surface of the intermediate spacer 471 are electrically connected by a through-hole, a via, or the like formed by copper plating or the like. The intermediate spacer 471 is electrically connected to the circuit board 40 and the fingerprint sensor 21 via the connecting electrodes.

With the intermediate spacer 471, even when the component thickness of the fingerprint sensor 21 in the card thickness direction Dt and the component thickness of the contact terminal 22 in the card thickness direction Dt are different, the surface position of the fingerprint sensor 21 in the card thickness direction Dt and the surface position of the contact terminal 22 in the card thickness direction Dt can be aligned by selecting the height of the intermediate spacer 471.

The fingerprint sensor 21 and the intermediate spacer 471 are joined together by a first conductive joining material 451a. The circuit board 40 and the intermediate spacer 471 are joined together by a second conductive joining material 451b. The joint-forming temperature of the first conductive joining material 451a and the joint-forming temperature of the second conductive joining material 451b are different from each other. In the present embodiment, the joint-forming temperature of the first conductive joining material 451a is higher than the joint-forming temperature of the second conductive joining material 451b. The first conductive joining material 451a may be, for example, Ag paste having a joint-forming temperature of 220° C., and the second conductive joining material 451b may be, for example, anisotropic solder having a joint-forming temperature of 180° C. or lower. In the present embodiment, the second conductive joining material 451b is the same material as the conductive joining material 450a, which joins the IC chip 31.

The joint-forming temperature of the first conductive joining material 451a is lower than the upper temperature limits of the fingerprint sensor 21 and the intermediate spacer 471 which are joined together. For example, in the present embodiment, when glass epoxy is used for the fingerprint sensor 21 and the intermediate spacer 471, a material having a joint-forming temperature of 250° C. or lower is selected as the first conductive joining material 451a. The joint-forming temperature of the first conductive joining material 451a is preferably between 200° C. and 250° C., inclusive. The joint-forming temperature of the second conductive joining material 451b is lower than the upper temperature limit of the circuit board 40. The joint-forming temperature of the second conductive joining material 451b may be, for example, between 120° C. and 180° C., inclusive. The joint-forming temperature of the second conductive joining material 451b is preferably between 120° C. and 170° C., inclusive. The difference between the joint-forming temperature of the first conductive joining material 451a and the joint-forming temperature of the second conductive joining material 451b may be, for example, 20° C. or higher. The difference between the joint-forming temperature of the first conductive joining material 451a and the joint-forming temperature of the second conductive joining material 451*b* is preferably 30° C. or higher.

Furthermore, card dimensions are specified in standards; for example, when the IC card 1 is a credit card, the thickness of the card body 10 is 0.76 mm. Therefore, there are appropriate ranges for the thickness of the first conductive joining material 451*a* and the thickness of the second conductive joining material 451*b*. In the present embodiment, the thickness of the first conductive joining material 451*a* is preferably between 5 μm and 100 μm, inclusive, and the thickness of the second conductive joining material 451*b* is preferably between 5 μm and 100 μm, inclusive.

In the present embodiment, the contact terminal 22 is a second exposed component that is directly joined to the circuit board 40. The contact terminal 22 is formed in the shape of a rectangle when viewed in the card thickness direction Dt. The contact terminal 22 can contact and electrically connect to an external contact terminal provided on a contact-type terminal device such as an automated teller machine. The contact terminal 22 is obtained by forming, by etching or the like, a conductor pattern on a surface of an insulating substrate made of glass epoxy, polyimide (PI), or the like, and then performing a plating process thereon using nickel, palladium, gold, or the like. In the present embodiment, the contact terminal 22 is disposed on the other side (the LH side) of the center portion of the front surface 10*f* of the card body 10 in the longitudinal direction D1 along the front surface 10*f* of the card body 10.

In the present embodiment, the contact terminal 22 is joined by a conductive joining material 450*b* to the front-surface-10*f*-side surface (the board front surface 40*f*) of the circuit board 40. In the present embodiment, the conductive joining material 450*b*, which is the same material as the second conductive joining material 451*b*, may be, for example, anisotropic solder having a joint-forming temperature of 180° C. or lower.

The fingerprint sensor 21, the contact terminal 22, and the intermediate spacer 471 are disposed so that a gap C is formed between each of these and the inner peripheral surface of the opening 410. When a metal material is used for the card body 10, the gap C is set by design so that no electrical short circuit occurs between the exposed component 20, the intermediate spacer 471, each of the conductive joining materials, and the card body 10.

The antenna 50 is formed along a periphery of the circuit board 40 and formed in the shape of a rectangle when viewed in the card thickness direction Dt. A single turn or two or more turns of the antenna 50 are formed along the periphery of the circuit board 40. The antenna 50 may be formed, for example, as a portion of the wiring pattern formed on the circuit board 40. Note that the antenna 50 may be separate from the circuit board 40. When the antenna 50 and the circuit board 40 are separate, the antenna 50 may be formed, for example, by positioning a sheet metal, a metallic foil, or a metal line formed into a predetermined antenna shape. In this case, the antenna 50 and the wiring pattern on the circuit board 40 are joined together by soldering, welding, pressure welding, or the like.

Figure 3:
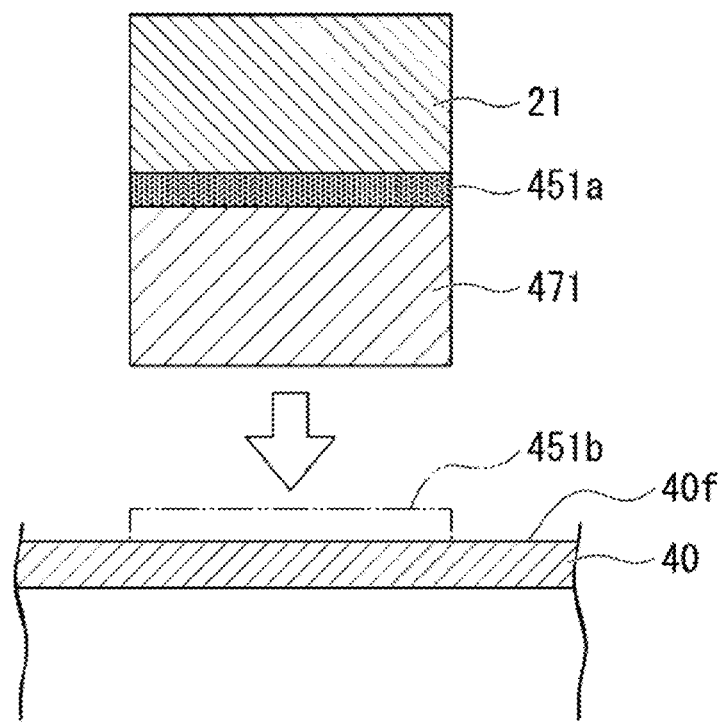
FIG. 3 is a cross-sectional view showing a part of processes according to the embodiment of the present invention in which an exposed component is joined.

Next, a method for manufacturing the IC card 1 according to the present embodiment will be described. FIG. 3 is a cross-sectional view showing a part of processes in which the fingerprint sensor 21 as the first exposed component is joined. The method for manufacturing the IC card 1 according to the present embodiment includes: a first joining step for joining the fingerprint sensor 21 and the intermediate spacer 471 together by the first conductive joining material 451*a*; and a second joining step for joining together, by the second conductive joining material 451*b*, the circuit board 40 and the intermediate spacer 471 joined to the fingerprint sensor 21. Specifically, after a step (upstream process) in which the fingerprint sensor 21 and the intermediate spacer 471 are joined together by the first conductive joining material 451*a* is performed, a step (downstream process) in which the intermediate spacer 471 and the circuit board 40 are joined together by the second conductive joining material 451*b* is performed.

As shown in FIG. 3, in the second joining step, a joined body obtained by joining the fingerprint sensor 21 and the intermediate spacer 471 moves toward the circuit board 40 from above, and thus the intermediate spacer 471 is joined to the board front surface 40*f*. The intermediate spacer 471 and the board front surface 40*f* are joined together using the second conductive joining material 451*b*. The intermediate spacer 471 and the board front surface 40*f* are brought into contact with each other via the second conductive joining material 451*b* heated into a state in which a joint can be formed, and then when the second conductive joining material 451*b* is cured, the intermediate spacer 471 and the board front surface 40*f* are thereby joined together.

At the time of joining the intermediate spacer 471 and the circuit board 40 together by the second conductive joining material 451*b*, heat needs to be applied to change the second conductive joining material 451*b* into the state in which a joint can be formed. Therefore, conventionally, with the heat applied at the time of joining the intermediate spacer 471 and the circuit board 40, the first conductive joining material 451*a* for joining the fingerprint sensor 21 and the intermediate spacer 471 may be at least partially melted, which may result in displacement of the fingerprint sensor 21 and the intermediate spacer 471. Thus, the fingerprint sensor 21 may be placed offset relative to the circuit board 40.

Regarding this issue, in the IC card 1 according to the present embodiment, the fingerprint sensor 21 as the first exposed component and the intermediate spacer 471 are joined together by the first conductive joining material 451*a*, the circuit board 40 and the intermediate spacer 471 are joined together by the second conductive joining material 451*b*, and the joint-forming temperature of the first conductive joining material 451*a* and the joint-forming temperature of the second conductive joining material 451*b* are different from each other. Therefore, the upstream process is performed first in which out of the first conductive joining material 451*a* and the second conductive joining material 451*b*, a conductive joining material having a higher joint-forming temperature is used for joining, followed by the downstream process in which out of the first conductive joining material 451*a* and the second conductive joining material 451*b*, a conductive joining material having a lower joint-forming temperature is used for joining. This allows the downstream process to be performed at a temperature lower than the temperature required in the upstream process to achieve joining with the conductive joining material. Therefore, for example, the conductive joining material used for the joining in the upstream process can be kept from being melted when heat is applied in the downstream process. Thus, for example, the joint between members joined in the upstream process can be kept from becoming loose or disengaged even when heat is applied in the downstream process. This means that in the downstream process in which the conductive joining material having a lower joint-forming temperature is used, heat is applied so as to reach a temperature at which the conductive joining material having a lower joint-forming temperature changes into the state in which a joint can be formed while the conductive joining material having a higher joint-forming temperature is not melted; thus, a joint can be formed in the downstream process while the joint between the members joined in the upstream process is kept from becoming loose or disengaged. Thus, the downstream process can be performed while the joint formed in the upstream process is maintained, and even when the intermediate spacer 471 is used, relative displacement of the exposed component 20 and the intermediate spacer 471 can be minimized. Therefore, according to the present embodiment, the exposed component 20, which is attached to the circuit board 40 with the intermediate spacer 471 interposed therebetween, can be positioned with improved precision. Furthermore, since the exposed component 20 can be positioned with improved precision, the interference of the exposed component 20 with the inner side surface of the opening 410 can be minimized.

Specifically, in the IC card 1 according to the present embodiment, the joint-forming temperature of the first conductive joining material 451a is higher than the joint-forming temperature of the second conductive joining material 451b. Therefore, as mentioned above, after a step (upstream process) in which the fingerprint sensor 21 as the first exposed component and the intermediate spacer 471 are joined together by the first conductive joining material 451a is performed, a step (downstream process) in which the intermediate spacer 471 joined to the fingerprint sensor 21 and the circuit board 40 are joined together by the second conductive joining material 451b is performed; thus, the intermediate spacer 471 and the circuit board 40 can be joined together by the second conductive joining material 451b while the joint between the fingerprint sensor 21 and the intermediate spacer 471 is kept from becoming loose or disengaged. Thus, the fingerprint sensor 21 upon attachment can be kept from being displaced relative to the circuit board 40. Therefore, the fingerprint sensor 21, which is attached to the circuit board 40 with the intermediate spacer 471 interposed therebetween, can be positioned with improved precision. Furthermore, in the downstream process, the fingerprint sensor 21 and the intermediate spacer 471 can be handled as one component to be mounted; therefore, the fingerprint sensor 21 can be easily mounted relative to the circuit board 40.

The difference between the joint-forming temperature of the first conductive joining material 451a and the joint-forming temperature of the second conductive joining material 451b may be, for example, 20° C. or higher. The difference between the joint-forming temperature of the first conductive joining material 451a and the joint-forming temperature of the second conductive joining material 451b is preferably 30° C. or higher. When two different conductive joining materials having such a temperature difference is used, the temperature to be applied to form a joint in the downstream process can be set sufficiently lower than the joint-forming temperature of the first conductive joining material 451a. Therefore, heating of the second conductive joining material 451b has less impact on the first conductive joining material 451a. Thus, for example, the joint between the members joined in the upstream process can be more favorably kept from becoming loose or disengaged even when heat is applied in the downstream process to form a joint using the second conductive joining material 451b.

In the IC card 1 according to the present embodiment, the exposed component 20 includes the contact terminal 22 as the second exposed component that is directly joined to the circuit board 40. In other words, in the present embodiment, a portion of the exposed component 20 is attached to the circuit board 40 without using the intermediate spacer 471. Therefore, the total number of components and the number of steps at the time of manufacture can be set smaller than when the intermediate spacer 471 is used for every exposed component 20.

In the IC card 1 according to the present embodiment, the first exposed component includes the fingerprint sensor 21, and the second exposed component includes the contact terminal 22. The fingerprint sensor 21 is more likely to be thinner than the contact terminal 22. Therefore, the intermediate spacer 471 is likely to be required to vertically align the fingerprint sensor 21 and the contact terminal 22. Regarding this issue, in the present embodiment, as mentioned above, the fingerprint sensor 21 can be kept from being displaced even when the intermediate spacer 471 is used, and thus the fingerprint sensor 21 can be positioned with high precision. Thus, when the first exposed component is the fingerprint sensor 21, the aforementioned advantageous effect of being able to position the exposed component 20 with improved precision can be more useful.

In contrast, the contact terminal 22 is more likely to be thicker than the fingerprint sensor 21. Therefore, even when the intermediate spacer 471 is not used in attaching the contact terminal 22 to the circuit board 40, the contact terminal 22 can be easily vertically aligned with the fingerprint sensor 21 attached to the circuit board 40 with the intermediate spacer 471 interposed therebetween. Therefore, the intermediate spacer 471 need not be used for the contact terminal 22, and the increase in the number of components in the IC card 1 can be minimized.

As described above, the fingerprint sensor 21, which is relatively likely to be thin, is joined to the circuit board 40 using the intermediate spacer 471, and the contact terminal 22, which is relatively likely to be thick, is directly joined to the circuit board 40; thus, each exposed component 20 can be positioned with high precision while the increase in the number of components in the IC card 1 is minimized.

(First Modification)

Figure 4:
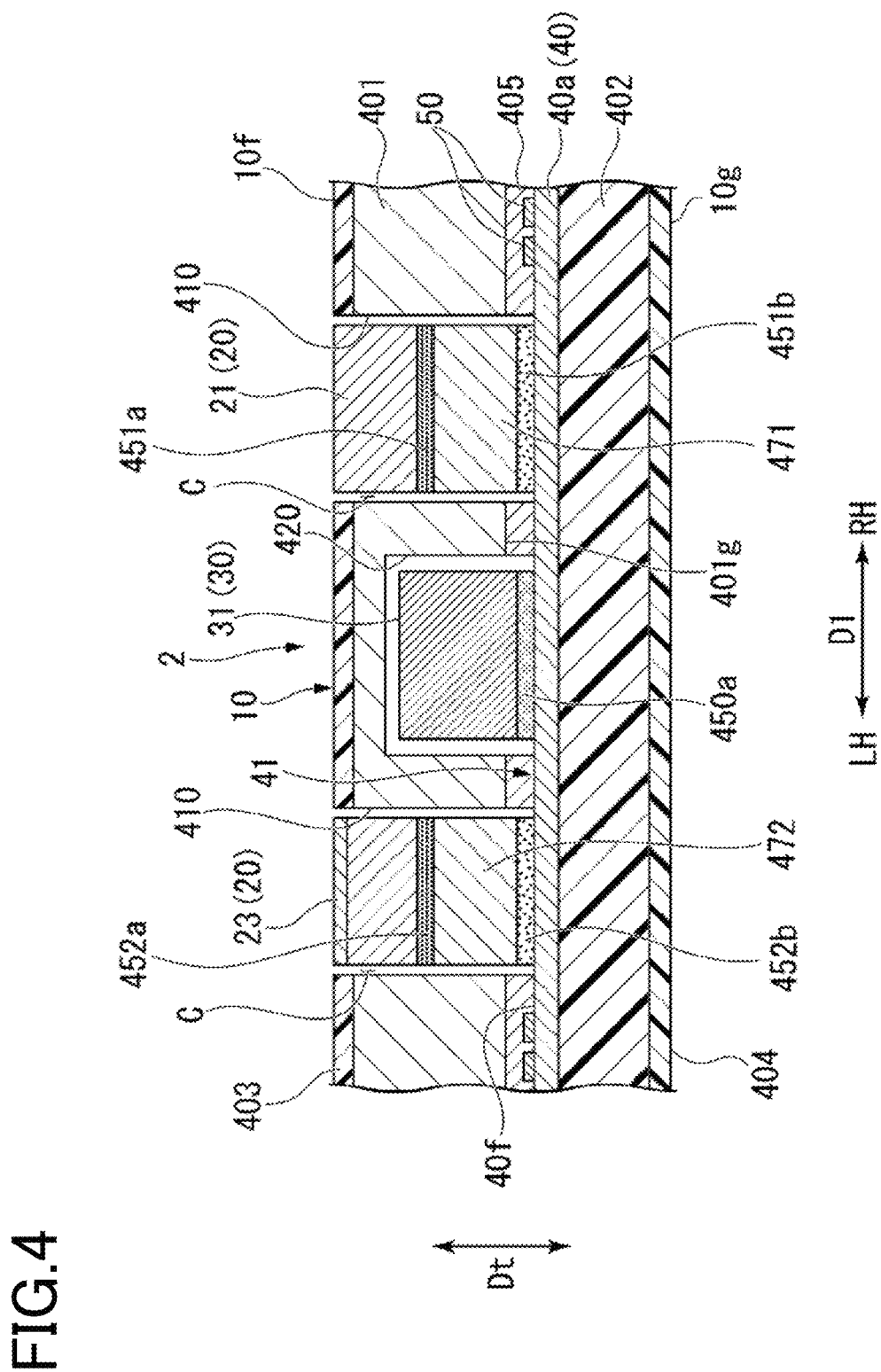
FIG. 4 is a cross-sectional view of an IC card according to a first modification of the embodiment of the present invention.

FIG. 4 is a cross-sectional view of an IC card 2 according to a first modification.

In the above-described embodiment, the fingerprint sensor 21 is joined to the circuit board 40 with the intermediate spacer 471 interposed therebetween, and the contact terminal 22 is directly joined to the circuit board 40; however, how the exposed components is joined is not limited to this embodiment. A contact terminal 23 may also be attached to the circuit board 40 with an intermediate spacer 472 interposed therebetween, as shown in FIG. 4. In other words, the exposed component 20 is not required to include the second exposed component that is directly joined to the circuit board 40. In the present modification, the contact terminal 23 is the first exposed component. The other features of the contact terminal 23 are the same as those of the contact terminal 22. The intermediate spacer 472 is substantially the same as the intermediate spacer 471 used for the fingerprint sensor 21, for example.

In the present modification, the contact terminal 23 is joined to the intermediate spacer 472 by a first conductive joining material 452a, as shown in FIG. 4. Furthermore, the intermediate spacer 472 is joined to the circuit board 40 by a second conductive joining material 452b. In the present modification, the joint-forming temperature of the first conductive joining material 452a is higher than the joint-forming temperature of the second conductive joining material 452b. Therefore, using a joining method that is substantially the same as a method for joining the fingerprint sensor 21 described in the above embodiment, the contact terminal 23, which is attached to the circuit board 40 with the intermediate spacer 472 interposed therebetween, can be positioned with improved precision.

The first conductive joining material 452a is, for example, the same material as the first conductive joining material 451a, which joins the fingerprint sensor 21 and the intermediate spacer 471 together. The second conductive joining material 452b is, for example, the same material as the second conductive joining material 451b, which joins the intermediate spacer 471 and the circuit board 40 together. Note that the first conductive joining material 452a may be a material different from the first conductive joining material 451a and may have a joint-forming temperature different from the joint-forming temperature of the first conductive joining material 451a. The second conductive joining material 452b may be a material different from the second conductive joining material 451b and may have a joint-forming temperature different from the joint-forming temperature of the second conductive joining material 451b.

With these intermediate spacers 472, 471, even when the component thickness of the fingerprint sensor 21 in the card thickness direction Dt and the component thickness of the contact terminal 23 in the card thickness direction Dt are different, the surface position of the fingerprint sensor 21 in the card thickness direction Dt and the surface position of the contact terminal 23 in the card thickness direction Dt can be favorably aligned by selecting the height of each of the intermediate spacers 472, 471.

(Second Modification)

Figure 5:
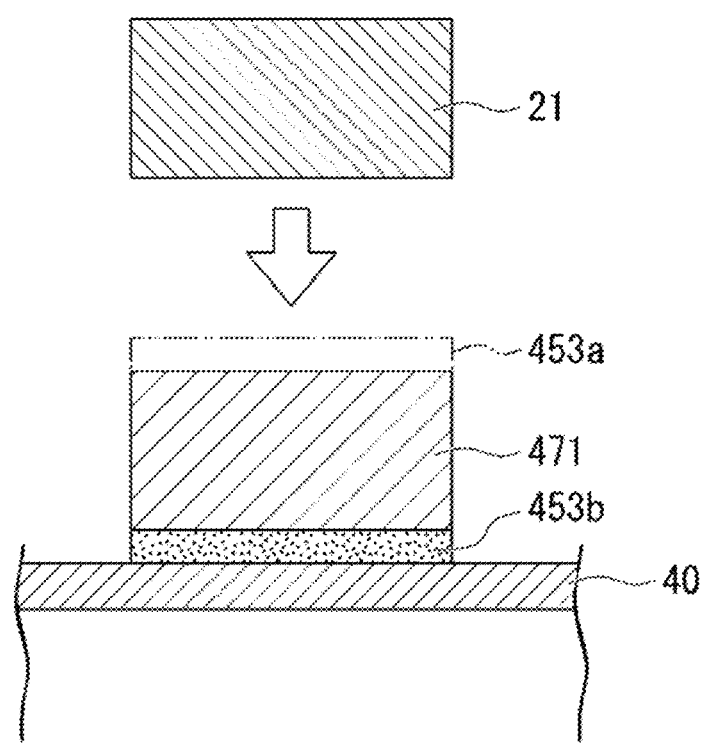
FIG. 5 is a cross-sectional view showing a part of processes according to a second modification of the embodiment of the present invention in which an exposed component is joined.

FIG. 5 is a cross-sectional view showing a part of processes according to a second modification in which the fingerprint sensor 21 as the first exposed component is joined.

In the above embodiment, the joint-forming temperature of the first conductive joining material 451a is higher than the joint-forming temperature of the second conductive joining material 451b. However, this is not limiting; the joint-forming temperature of the second conductive joining material may be higher than the joint-forming temperature of the first conductive joining material.

A method for manufacturing an IC card according to the second modification of the present embodiment includes: joining the circuit board 40 and the intermediate spacer 471 together by a second conductive joining material 453b; and joining together, by a first conductive joining material 453a, the intermediate spacer 471 joined to the circuit board 40 and the fingerprint sensor 21 as the first exposed component, as shown in FIG. 5. Specifically, after a step (upstream process) is performed in which the intermediate spacer 471 and the circuit board 40 are joined together by the second conductive joining material 453b, a step (downstream process) is performed in which the fingerprint sensor 21 and the intermediate spacer 471 are joined together by the first conductive joining material 453a. In these processes, the joint-forming temperature of the second conductive joining material 453b is higher than the joint-forming temperature of the first conductive joining material 453a. The first conductive joining material 453a can be selected in substantially the same manner as the second conductive joining material 451b described above. The second conductive joining material 453b can be selected in substantially the same manner as the first conductive joining material 451a described above. The first conductive joining material 453a is, for example, anisotropic solder having a joint-forming temperature of 180° C. or lower, and the second conductive joining material 453b is, for example, Ag paste having a joint-forming temperature of 220° C.

As mentioned above, in the present modification, the joint-forming temperature of the second conductive joining material 453b is higher than the joint-forming temperature of the first conductive joining material 453a. Therefore, when joining the fingerprint sensor 21 and the intermediate spacer 471 using the first conductive joining material 453a in the downstream process, even when heat is applied to change the first conductive joining material 453a into a state in which a joint can be formed, the joint between the intermediate spacer 471 and the circuit board 40 can be kept from becoming loose or disengaged. Thus, the fingerprint sensor 21 can be kept from being displaced relative to the circuit board 40, and the fingerprint sensor 21 can be positioned with improved precision.

An embodiment of the present invention has so far been described in detail with reference to the drawings. However, specific configurations are not limited to this embodiment. The present invention should encompass modifications, combinations, or the like of the configurations in the range not departing from the spirit of the present invention.

For example, the components to be mounted as the encapsulated component 30, the exposed component 20, and the like are not limited to the IC chip 31, the fingerprint sensor 21, and the contact terminal 22; other components may be mounted as appropriate. Furthermore, in the above embodiment, two types of the exposed components 20, the fingerprint sensor 21 and the contact terminal 22, are provided, but this is not limiting. The type, number, etc., of exposed components 20, encapsulated components 30, and the like can be modified accordingly. Furthermore, the card-type medium is exemplified by an IC card 1 which is used as a credit card, but the form and the application thereof are not limited.

The combination of the joint-forming temperatures of the conductive joining materials is not limited as long as the combination is appropriate for the combination of manufacturing steps. For example, in the first modification, the joint-forming temperature of the first conductive joining material 451a may be higher than the joint-forming temperature of the second conductive joining material 451b, and the joint-forming temperature of the second conductive joining material 452b may be higher than the joint-forming temperature of the first conductive joining material 452a. In this case, the fingerprint sensor 21 is joined to the circuit board 40 in the joining method shown in FIG. 3, and the contact terminal 23 is joined to the circuit board 40 in the joining method shown in FIG. 5.

Furthermore, the conductive joining joimaterial that directly joins the exposed component and the circuit board and the conductive joining material that directly joins the encapsulated component and the circuit board are not limited to those described in the above embodiment. For example, the conductive joining material that directly joins the exposed component and the like to the circuit board may be the same material as a conductive joining material having a higher joint-forming temperature among the first conductive joining material and the second conductive joining material or may be a material different from both of the first conductive joining material and the second conductive joining material. Furthermore, the conductive joining material having a higher joint-forming temperature is not limited to the Ag paste and may be another material such as an ACF (anisotropic conductive film) or ACP (anisotropic conductive paste), for example. ACF and the ACP are, for example, film-shaped and paste-like materials in which conductive particles are dispersed in a thermoplastic resin. Furthermore, the first conductive joining material and the second conductive joining material may be solder containing only an alloy. In this case, the conductive joining material having a higher joint-formation temperature may be solder having a relatively high melting point, and the conductive joining material having a lower joint-formation temperature may be solder having a relatively low melting point such as low-temperature solder.

REFERENCE SIGNS LIST 1, 2 . . . IC card (Card-type medium); 10 . . . Card body; 10*f* . . . Front surface; 20 . . . Exposed component; 21 . . . Fingerprint sensor (First exposed component); 22 . . . Contact terminal (Second exposed component); 23 . . . Contact terminal (First exposed component); 40 . . . Circuit board; 410 . . . Opening; 451*a*, 452*a*, 453*a* . . . First conductive joining material; 451*b*, 452*b*, 453*b* . . . Second conductive joining material; 471, 472 . . . Intermediate spacer.

What is claimed is:

1. A card-type medium, comprising:
   a card body;
   an exposed component that is accommodated inside an opening formed in a front surface of the card body and is disposed so as to be partially exposed on the front surface; and
   a circuit board that is embedded in the card body and to which the exposed component is attached, wherein
   the exposed component includes a first exposed component that is attached to the circuit board with an intermediate spacer interposed therebetween,
   the first exposed component and the intermediate spacer are joined together by a first conductive joining material,
   each of the first exposed component and the intermediate spacer comprises glass epoxy;
   the circuit board and the intermediate spacer are joined together by a second conductive joining material, and,
   a difference between a joint-forming temperature of the first conductive joining material and a joint-forming temperature of the second conductive joining material is 20° C. or higher.

2. The card-type medium of claim 1, wherein
   the joint-forming temperature of the first conductive joining material is higher than the joint-forming temperature of the second conductive joining material.

3. A card-type medium manufacturing method for manufacturing the card-type medium of claim 2, the card-type medium manufacturing method comprising the steps of:
   joining the first exposed component and the intermediate spacer together by the first conductive joining material; and
   joining the intermediate spacer joined to the first exposed component and the circuit board together by the second conductive joining material.

4. The card-type medium of claim 2, wherein the difference between a joint-forming temperature of the first conductive joining material and a joint-forming temperature of the second conductive joining material is 30° C. or higher.

5. The card-type medium of claim 1, wherein
   the joint-forming temperature of the second conductive joining material is higher than the joint-forming temperature of the first conductive joining material.

6. A card-type medium manufacturing method for manufacturing the card-type medium of claim 3, the card-type medium manufacturing method comprising the steps of:
   joining the circuit board and the intermediate spacer together by the second conductive joining material; and,
   joining the intermediate spacer joined to the circuit board and the first exposed component together by the first conductive joining material.

7. The card-type medium of claim 5, wherein the difference between a joint-forming temperature of the first conductive joining material and a joint-forming temperature of the second conductive joining material is 30° C. or higher.

8. The card-type medium of claim 1, wherein
   the exposed component includes a second exposed component that is directly joined to the circuit board.

9. The card-type medium of claim 8, wherein
   the first exposed component includes a fingerprint sensor, and
   the second exposed component includes a contact terminal.

10. The card-type medium of claim 1, wherein the difference between a joint-forming temperature of the first conductive joining material and a joint-forming temperature of the second conductive joining material is 30° C. or higher.

11. The card-type medium of claim 1, wherein the joint-forming temperature of the first conductive joining material is between 200° C. and 250° C., inclusive and the joint-forming temperature of the second conductive joining material is between 120° C. and 180° C., inclusive.

12. The card-type medium of claim 11, wherein the joint-forming temperature of the second conductive joining material is between 120° C. and 170° C., inclusive.

13. The card-type medium of claim 11, wherein the first exposed component is a fingerprint sensor.

14. The card-type medium of claim 1, wherein the joint-forming temperature of the second conductive joining material is between 120° C. and 170° C., inclusive.

15. The card-type medium of claim 1, wherein the first exposed component is a fingerprint sensor.

* * * * *